US012451063B2

(12) United States Patent
Zhang

(10) Patent No.: US 12,451,063 B2
(45) Date of Patent: Oct. 21, 2025

(54) PIXEL CIRCUIT AND DISPLAY PANEL

(71) Applicant: WUHAN CHINA STAR OPTOELECTRONICS SEMICONDUCTOR DISPLAY TECHNOLOGY CO., LTD., Wuhan (CN)

(72) Inventor: Shuyuan Zhang, Wuhan (CN)

(73) Assignee: WUHAN CHINA STAR OPTOELECTRONICS SEMICONDUCTOR DISPLAY TECHNOLOGY CO. LTD., Wuhan (CN)

( * ) Notice: Subject to any disclaimer, the term of this patent is extended or adjusted under 35 U.S.C. 154(b) by 0 days.

(21) Appl. No.: 17/798,997

(22) PCT Filed: Jul. 21, 2022

(86) PCT No.: PCT/CN2022/106969
§ 371 (c)(1),
(2) Date: Aug. 11, 2022

(87) PCT Pub. No.: WO2024/000701
PCT Pub. Date: Jan. 4, 2024

(65) Prior Publication Data

US 2024/0194135 A1 Jun. 13, 2024

(30) Foreign Application Priority Data

Jun. 29, 2022 (CN) ......................... 202210756159.0

(51) Int. Cl.
*G09G 3/3233* (2016.01)
*G09G 3/32* (2016.01)
(Continued)

(52) U.S. Cl.
CPC ............. *G09G 3/3233* (2013.01); *G09G 3/32* (2013.01); *H10D 86/40* (2025.01); *H10D 86/60* (2025.01);
(Continued)

(58) Field of Classification Search
CPC ....................... G09G 3/3233; G09G 2320/045
See application file for complete search history.

(56) References Cited

U.S. PATENT DOCUMENTS 11,854,473 B2 * 12/2023 Lai ....................... G09G 3/3233
12,170,063 B2 * 12/2024 Chen .................... G09G 3/3233
(Continued)

FOREIGN PATENT DOCUMENTS

CN 107123397 A 9/2017
CN 107591124 A 1/2018
(Continued)

OTHER PUBLICATIONS

PCT International Search Report for International Application No. PCT/CN2022/106969, mailed on Dec. 22, 2022, 10pp.
(Continued)

*Primary Examiner* — William Boddie
*Assistant Examiner* — Bipin Gyawali
(74) *Attorney, Agent, or Firm* — The Roy Gross Law Firm, LLC; Roy D. Gross

(57) ABSTRACT

A pixel circuit and a display panel are disclosed. The pixel circuit includes a driving transistor, a write-in transistor, and first and second transistors. The driving transistor has a source, a drain, and a gate. The write-in transistor has a source connected to one of source and drain of the driving transistor, a drain connected to a data line, and a gate connected to a first wire. The first transistor has a source connected to a second wire, a drain connected to one of source and drain of the driving transistor, and a gate con-
(Continued)

nected to a third wire. The second transistor has a source connected to the drain of the driving transistor, a drain connected to the gate of the driving transistor, and a gate connected to a fourth wire. The first transistor switches on/off state once before and after each duty cycle of the write-in transistor.

17 Claims, 7 Drawing Sheets

(51) Int. Cl.
*H10D 86/40* (2025.01)
*H10D 86/60* (2025.01)
*H10K 59/121* (2023.01)

(52) U.S. Cl.
CPC ... *H10K 59/1213* (2023.02); *G09G 2310/061* (2013.01); *G09G 2320/0233* (2013.01)

(56) References Cited

U.S. PATENT DOCUMENTS

| | | | | |
|---|---|---|---|---|
| 2019/0096337 | A1* | 3/2019 | Zhu | G09G 3/3258 |
| 2021/0407383 | A1* | 12/2021 | Lai | G09G 3/32 |
| 2021/0407386 | A1* | 12/2021 | Li | G09G 3/3291 |
| 2022/0059030 | A1* | 2/2022 | Sang | G09G 3/3233 |
| 2022/0180810 | A1* | 6/2022 | Zhang | G09G 3/3241 |
| 2024/0078976 | A1* | 3/2024 | Cheng | G09G 3/3233 |
| 2024/0221646 | A1* | 7/2024 | Chen | G09G 3/3233 |
| 2024/0347000 | A1* | 10/2024 | Zhang | G09G 3/3233 |
| 2025/0218362 | A1* | 7/2025 | Tao | G09G 3/3258 |

FOREIGN PATENT DOCUMENTS

| | | | | |
|---|---|---|---|---|
| CN | 109087610 A | | 12/2018 | |
| CN | 110033734 A | * | 7/2019 | G09G 3/3208 |
| CN | 112086070 A | | 12/2020 | |
| CN | 112233621 A | | 1/2021 | |
| CN | 112397026 A | | 2/2021 | |
| CN | 113140179 A | | 7/2021 | |
| CN | 113870789 A | | 12/2021 | |
| CN | 113906495 A | | 1/2022 | |
| CN | 113950715 A | | 1/2022 | |
| WO | 2022123776 A1 | | 6/2022 | |

OTHER PUBLICATIONS

PCT Written Opinion of the International Search Authority for International Application No. PCT/CN2022/106969, mailed on Dec. 22, 2022, 9pp.

Chinese Office Action issued in corresponding Chinese Patent Application No. 202210756159.0 dated Oct. 8, 2024, pp. 1-10.

Chinese Office Action issued in corresponding Chinese Patent Application No. 202210756159.0 dated Mar. 14, 2025, pp. 1-10, 22pp.

* cited by examiner

PIXEL CIRCUIT AND DISPLAY PANEL

CROSS REFERENCE TO RELATED APPLICATIONS

This application is a US national phase application based upon an International Application No. PCT/CN2022/106969, filed on Jul. 21, 2022, which claims the priority of Chinese Patent Application No. 202210756159.0, entitled "PIXEL CIRCUIT AND DISPLAY PANEL", filed on Jun. 29, 2022, the disclosure of which is incorporated herein by reference in its entirety.

FIELD OF THE DISCLOSURE

The present disclosure relates to a display technology, and more particularly, to a pixel circuit and a display panel.

BACKGROUND

The pixel circuit is in a low-frequency working mode and in one frame of time, the data signal can be written into the gate of the driving transistor in the first duty cycle of the corresponding transistor. The data signal can only be written into one or two electrodes of the driving transistor other than the gate in another other duty cycle in the same frame. Because the data signal is written continuously, the voltage levels of the three electrodes of the driving transistor will change. Affected by the hysteresis characteristics, and the threshold voltage (Vth) of the driving transistor will shift, which results in luminance inconsistency between the first duty cycle and subsequent duty cycles in the same frame. This luminance difference will cause the brightness to change regularly, resulting in severe flickers.

SUMMARY

Technical Problem

One objective of an embodiment of the present disclosure is to provide a pixel circuit and a display panel, in order to alleviate the above-mentioned threshold voltage shift of the driving transistor in the low frequency working mode.

Technical Solution

According to a first aspect of the present disclosure, a pixel circuit is disclosed. The pixel circuit comprises a driving transistor, a write-in transistor, a first transistor, and a second transistor. The driving transistor has a source, a drain and a gate. The write-in transistor has a source, a drain and a gate. One of the source and drain of the write-in transistor is connected to one of the source and drain of the driving transistor, the other of the source and drain of the write-in transistor is connected to a data line, the gate of the write-in transistor is connected to a first wire. The first transistor has a source, a drain and a gate. One of the source and drain of the first transistor is connected to a second wire, and the other of the source and drain of the first transistor is connected to one of the source and drain of the driving transistor, the gate of the first transistor is connected to a third wire. The second transistor has a source, a drain and a gate. One of the source and drain of the second transistor is connected to the other of the source and drain of the driving transistor, and the other of the source and drain of the second transistor is connected to the gate of the driving transistor, and the gate of the second transistor is connected to a fourth wire. The first transistor switches its on/off state at least once before and after each duty cycle of the write-in transistor.

In some embodiments, the second wire respectively reset a voltage level of one of the source and drain of the driving transistor through the first transistor before and after each duty cycle of the write-in transistor.

In some embodiments, before each duty cycle of the write-in transistor, the source takes a first reset time to reset the voltage level of one of the source and drain of the driving transistor. After each duty cycle of the write-in transistor, the source takes a second reset time to reset the voltage level of one of the source and drain of the driving transistor. The first reset time is equal to the second reset time.

In some embodiments, the pixel circuit further comprises a third transistor and a light emitting device. The third transistor has a source, a drain and a gate. One of the source and drain of the third transistor is connected to the other of the source and drain of the driving transistor, and the gate of the third transistor is connected to a fifth wire. The light emitting device has an anode connected to the drain of the third transistor, and a cathode connected to a sixth wire. When the third transistor is turned off, the first transistor switches its on/off state at least once before and after each duty cycle of the write-in transistor.

In some embodiments, the first wire is configured to transfer a first control signal; the third wire is configured to transfer a third control signal. The fifth wire is configured to transfer a fifth control signal. Each duty cycle comprises at least one pulse of the first control signal. Before each duty cycle, a time period between a rising edge of a pulse of the third control signal and a rising edge of a pulse of the fifth control signal is the first reset time of one of the source and drain of the driving transistor. After each duty cycle, a time period between a falling edge of the pulse of the third control signal and a falling edge of the pulse of the fifth control signal is the second reset time of one of the source and drain of the driving transistor.

In some embodiments, a time period between a falling edge of a first pulse of the third control signal and a falling edge of a first pulse of the fifth control signal is the second reset time. A time period between a falling edge of a second pulse of the third control signal and a falling edge of a second pulse of the fifth control signal is also the second reset time; and the second pulse is behind the first pulse in timing.

In some embodiments, the first reset time is equal to the second reset time.

In some embodiments, a channel type of the first transistor is different from a channel type of the second transistor; and the third wire and the fourth wire are a same wire.

In some embodiments, the first transistor and the second transistor are both N-channel thin film transistor (TFT); the third wire is different from the fourth wire; the first wire is configured to transfer a first control signal, the third wire is configured to transfer a seventh control signal; and the seventh control signal respectively has at least one positive pulse before and after each duty cycle.

In some embodiments, before each duty cycle, the seventh control signal has a first positive pulse. After each duty cycle, the seventh control signal has a second positive pulse. A time duration of the first positive pulse is equal to a time duration of the second positive pulse.

In some embodiments, when the third transistor is turned off, the first transistor is turned on at least once before and after one duty cycle.

In some embodiments, the pixel circuit further comprises a first initializing transistor has a source, a drain and a gate.

One of the source and drain of the first initializing transistor is connected to the anode of the light emitting device, and the other of the source and drain of the first initializing transistor is electrically connected to a first initializing wire, and the gate of the first initializing transistor is connected to the fifth wire or a seventh wire.

In some embodiments, under a condition that the third transistor is a P-channel TFT and the first initializing transistor is an N-channel TFT, the gate of the first initializing transistor is connected to the fifth wire; or under a condition that the third transistor and the first initializing transistor are both P-channel TFTs, the seventh wire is configured to transfer an eighth control signal, the first wire is configured to transfer a first control signal and the first control signal is behind the eighth control signal in timing.

In some embodiments, the first wire is configured to transfer a first control signal and the fourth wire is configured to transfer a fourth control signal. Each duty cycle of the fourth control signal corresponds to at least one duty cycle of the first control signal.

In some embodiments, in one frame, a first duty cycle of the first control signal at least partially overlaps with one duty cycle of the fourth control signal; and the fourth control signal does not have another duty cycle within the frame.

In some embodiments, a starting time of a duty cycle of the fourth control signal is prior to a starting time of a first duty cycle of the first control signal. An ending time of the duty cycle fourth control signal is later than an ending time of the first duty cycle of the first control signal.

In some embodiments, the first transistor is a P-channel TFT; the third wire is configured to transfer a tenth control signal. Before each duty cycle of the write-in transistor, a voltage level of the tenth control signal is orderly a high voltage level, a low voltage level and a high voltage level. After each duty cycle of the write-in transistor, the voltage level of the tenth control signal is orderly a high voltage level, a low voltage level and a high voltage level. During each duty cycle of the write-in transistor, the voltage level of the tenth control signal is maintained as a high voltage level.

In some embodiments, a time duration that the tenth control signal is in the low voltage level before each duty cycle of the write-in transistor is equal to a time duration that the tenth control signal is in the low voltage level after each duty cycle of the write-in transistor.

In some embodiments, the second transistor is a P-channel TFT; the first wire is connected to the fourth wire.

In some embodiments, the pixel circuit further comprises a second initializing transistor, having a source connected to the gate of the driving transistor, a drain connected to a second initializing wire, and a gate connected to the gate of the first initializing transistor.

In some embodiments, the first and second initializing transistors are double-gate TFTs.

According to a second aspect of the present disclosure, a display panel comprising a pixel circuit is disclosed. The pixel circuit comprises a driving transistor, a write-in transistor, a first transistor, and a second transistor. The driving transistor has a source, a drain and a gate. The write-in transistor has a source, a drain and a gate. One of the source and drain of the write-in transistor is connected to one of the source and drain of the driving transistor, the other of the source and drain of the write-in transistor is connected to a data line, the gate of the write-in transistor is connected to a first wire. The first transistor has a source, a drain and a gate. One of the source and drain of the first transistor is connected to a second wire, and the other of the source and drain of the first transistor is connected to one of the source and drain of the driving transistor, the gate of the first transistor is connected to a third wire. The second transistor has a source, a drain and a gate. One of the source and drain of the second transistor is connected to the other of the source and drain of the driving transistor, and the other of the source and drain of the second transistor is connected to the gate of the driving transistor, and the gate of the second transistor is connected to a fourth wire. The first transistor switches its on/off state at least once before and after each duty cycle of the write-in transistor. As a frame rate of the display panel decreases, a frequency of the first control signal remains unchanged, and a frequency of the fourth control signal decreases.

Advantageous Effect

The pixel circuit and display panel in the present disclosure could use the first transistor to respectively switch at least once its switching state before and after each duty cycle of the write-in transistor. This could reset the voltage level of one electrode of the driving transistor every time when the switching state is switched. In this way, the voltage level of the electrode of the driving transistor can be stabilized in the low-frequency working mode, and the voltage level of another electrode of the driving transistor is related to the voltage level of the electrode of the driving transistor. Accordingly, when the electrode of the driving transistor has a stable voltage level, the another electrode of the driving transistor could also have a stable voltage level. In this way, the driver transistor can maintain the stabilities of the voltage levels of the three electrodes of the driving transistor in the high and low frequency working modes, which alleviates the threshold voltage shift of the driving transistor in the low frequency working mode and also alleviates the flickers caused by the regular change of luminance.

Furthermore, because the first transistor can not only reset the electrode of the driving transistor in the non-light-emitting stage, but also control the light emitting current in the light-emitting stage, this could reduce the number of thin film transistors used in the pixel circuit, simplify the structure of the pixel circuit, and improve the pixel density because the first transistor has multiple uses.

DETAILED DESCRIPTION OF PREFERRED EMBODIMENTS

To help a person skilled in the art better understand the solutions of the present disclosure, the following clearly and completely describes the technical solutions in the embodiments of the present invention with reference to the accompanying drawings in the embodiments of the present invention. Apparently, the described embodiments are a part rather than all of the embodiments of the present invention. All other embodiments obtained by a person of ordinary skill in the art based on the embodiments of the present invention without creative efforts shall fall within the protection scope of the present disclosure.

Figure 1:
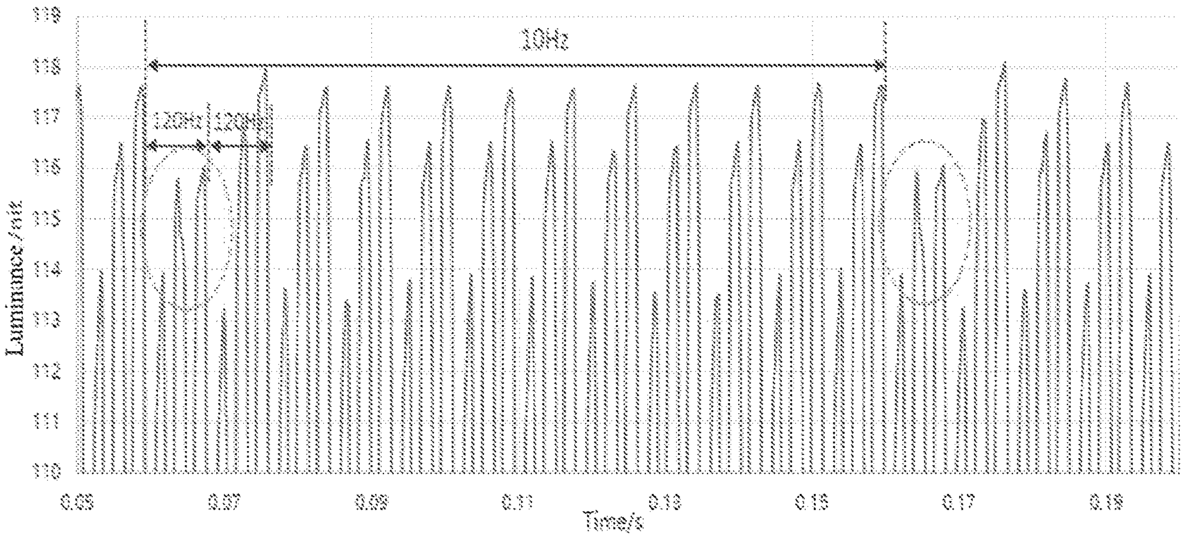
FIG. 1 is a diagram showing the luminance difference caused by switching the high-frequency display to the low-frequency display according to a conventional art.

Please refer to FIG. 1. FIG. 1 is a diagram showing the luminance difference caused by switching the high-frequency display to the low-frequency display according to a conventional art. The vertical axis represents the luminance and the unit is nit. The horizontal axis represents the time and the unit is second (s). Under the corresponding resolution, one frame time at the 10 Hz frame rate is equivalent to the 12 frame time at the 120 Hz frame rate. However, the data signals of each frame at the 120 Hz frame rate can be all written into the gates of the driving transistors. At the 10 Hz frame rate, the data signals could be only written to the gates of the driving transistors within the first 120 Hz frame time, which means that the data signals are not be written into the gates within the subsequent eleven 120 Hz frame time. Instead, the data signals are written into the sources or drains of the driving transistors within the subsequent eleven 120 Hz frame time. This results in a luminance difference between the first 120 Hz frame time and the subsequent 11 120 Hz frame times. This luminance difference leads to regular changes in luminance, and thus further leads to severe flicker issue.

Figure 2:
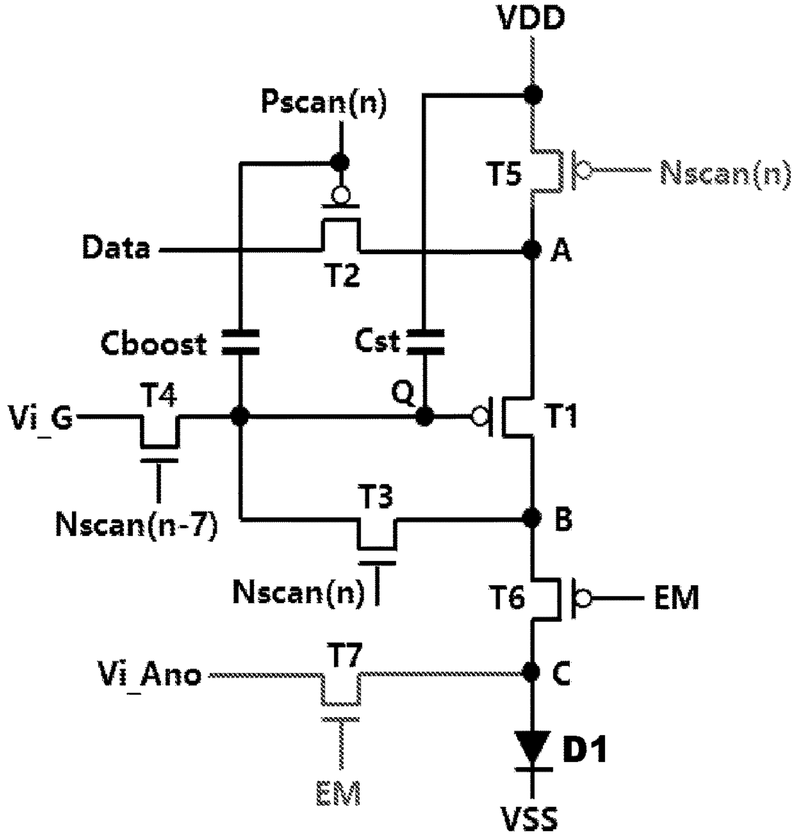
FIG. 2 is a diagram of a pixel circuit according to a first embodiment of the present disclosure.

According to an embodiment of the present disclosure, a pixel circuit is disclosed. As shown in FIG. 2, the pixel circuit comprises a driving transistor T1, a write-in transistor T2, a first transistor T5 and a second transistor T3. One of the source and drain of the write-in transistor T2 is connected to one of the source and drain of the driving transistor T1 is connected. The other of the source and drain of the write-in transistor T2 is connected to the data line. The gate of the write-in transistor T2 is connected to the first wire. One of the source and drain of the first transistor T5 is connected to the second wire. The drain of the first transistor T5 is connected to one of the source and drain of the driving transistor T1. The gate of the first transistor T5 is connected to the third wire. One of the source and drain of the second transistor T3 is connected to the other of the source and drain of the driving transistor T1. The other of the source and drain of the second transistor T3 is connected to the gate of the driving transistor T1. The gate of the second transistor T3 is connected to the fourth wire. Here, before and after each duty cycle of the write-in transistor T2, the first transistor T5 switches its switching state (on/off state) at least once.

In this embodiment, the pixel circuit utilizes the first transistor T5 to respectively switch at least once its switching state before and after each duty cycle of the write-in transistor T2. This could reset the voltage level of one electrode of the driving transistor T1 every time when the switching state is switched. In this way, the voltage level of the electrode of the driving transistor T1 can be stabilized in the low-frequency working mode, and the voltage level of another electrode of the driving transistor T1 is related to the voltage level of the electrode of the driving transistor. Accordingly, when the electrode of the driving transistor T1 has a stable voltage level, the another electrode of the driving transistor T1 could also have a stable voltage level. In this way, the driver transistor T1 can maintain the stabilities of the voltage levels of the three electrodes of the driving transistor T1 in the high and low frequency working modes, which alleviates the threshold voltage shift of the driving transistor T1 in the low frequency working mode and also alleviates the flickers caused by the regular change of luminance.

The operation that the first transistor T5 switches its switching state means that the first transistor T5 switches its state from a conducting/on state to a cut-off/off state. Or, it could mean that the first transistor T5 switches its state from a cut-off/off state to a conducting/on state. Both mean that the first transistor T5 has been turned on before and after each duty cycle, which could reset the voltage level of the source or the drain of the driving transistor T1.

In this embodiment, the second wire could provide a needed constant voltage signal or an AC/DC voltage signal. Thus, the voltage provided by the second wire is not limited to the positive power signal VDD shown in FIG. 2, FIG. 5 and FIG. 7. It could be understood that when the second wire provides the positive power signal VDD, the first transistor T5 can not only reset an electrode of the driving transistor T1 in the non-light-emitting stage, but also control the light-emitting current in the light-emitting. This could reduce the number of thin film transistors used in the pixel circuit, simplify the structure of the pixel circuit, and improve the pixel density because the first transistor has multiple uses. The one electrode of the driving transistor T1 can be one of the source and drain of the transistor T1, and the another electrode of the driving transistor T1 can be the other of the source and drain of the driver transistor T1.

In another embodiment, the pixel circuit further comprises a third transistor T6 and a light emitting device D1. One of the source and drain of the third transistor T6 is connected to the other of the source and drain of the driving transistor T1. The gate of the third transistor T6 is connected to the fifth wire. The anode of the light-emitting device D1 is connected to the other of the source and drain of the third transistor T6, and the cathode of the light-emitting device D1 is connected to the sixth wire.

The third transistor T6 is used to allow the light-emitting current to flow through the light-emitting device D1 in the light-emitting phase and to prevent the light-emitting current from flowing through the light-emitting device D1 in the non-light-emitting phase.

Here, the sixth wire could be used to transmit a negative power signal VSS. The negative power signal VSS and the positive power signal VDD constitute a DC power supply, which provides a corresponding driving voltage or a light-emitting current for the light-emitting device D1.

The light-emitting device D1 could be mini light emitting diode (LED), a micro LED, a quantum dot LED or an organic light emitting diode (OLED).

As shown in FIG. 2, the pixel circuit further comprises a first initializing transistor T7. One of the source and drain of the first initializing transistor T7 is connected to the anode of the light emitting device D1. The other of the source and drain of the first initializing transistor T7 is electrically connected to the first initializing wire. The gate of the first initializing transistor T7 is connected to the fifth wire.

Since the gate of the first initializing transistor T7 and the gate of the third transistor T6 share the same fifth wire. The number of wires required for the pixel circuit can be reduced. In this case, the third transistor T6 and the first initializing transistor T7 need to be implemented with thin film transistors (TFTs) of different channel types. For example, in this embodiment, the third transistor T6 is a P-channel TFT, and the first initializing transistor T7 is an N-channel TFT. Or, alternatively, the third transistor T6 can be implemented with an N-channel TFT and the first initializing transistor T7 is a P-channel TFT.

The first initializing transistor T7 could be used to initialize the voltage level of the anode of the light-emitting device D1 to be a specific voltage level. In this case, the first initializing line could be used to transmit the first initializing signal Vi_Ano, which has the above-mentioned specific voltage level, such as −2.5V.

The fifth control signal transmitted by the fifth wire can have a higher frequency or more pulses, which can meet the customer's multiple demands, improve the initialization frequency of the voltage level of the of the light-emitting device D1, and reduce or avoid the risk of incorrectly lightening light-emitting device D1.

Figure 7:
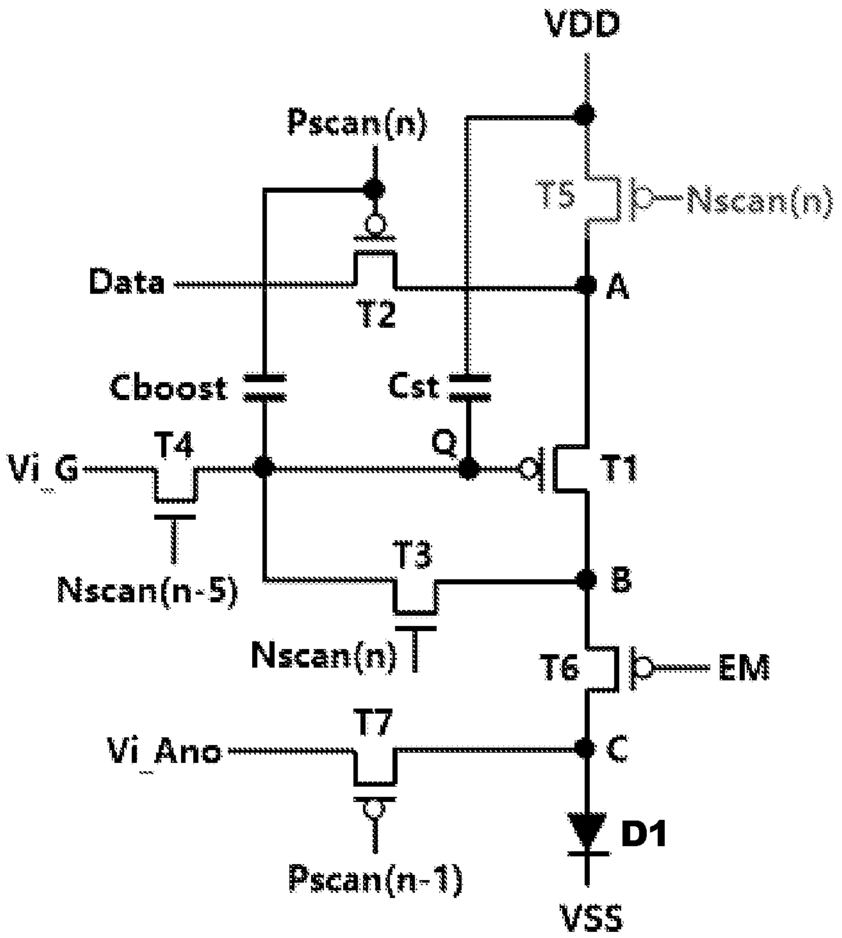
FIG. 7 is a diagram of a pixel circuit according to a third embodiment of the present disclosure.

In the pixel circuit shown in FIG. 2 and FIG. 7, the fifth control signal could be a control signal EM or any other applicable control signal.

The pixel circuit further comprises a second initializing transistor T4. One of the source and drain of the second initializing transistor T4 is connected to the gate of the driving transistor T1. The other of the source and drain of the second initializing transistor T4 is electrically connected to the second initializing wire. The gate of the second initializing transistor T4 is connected to the eighth wire.

The second initializing transistor T4 could be used to initialize the voltage level of the gate of the driving transistor T1. In this case, the second initializing wire could be used to transmit the second initializing signal Vi_G. The voltage level of the second initializing signal Vi_G can be set according to the needs of the pixel circuit, such as −3.5V.

The eighth wire could be used to transmit a ninth control signal. The ninth control signal is prior to the fourth control signal in timing. For example, the ninth control signal may be one of the $(n-1)^{th}$-stage scan signal to the $(n-8)^{th}$-stage scan signal. Specifically, the ninth control signal may be one of the $(n-1)^{th}$-stage scan signal to the $(n-8)^{th}$-stage scan signal. Preferably, the ninth control signal could be the $(n-7)^{th}$-stage scan signal Nscan(n−7) having a positive pulse shown in FIG. 2 and FIG. 5 or the $(n-5)^{th}$-stage scan signal Nscan(n−5) having a positive pulse shown in FIG. 7.

The fourth control signal could be, but not limited to, a $n^{th}$-stage scan signal having a positive pulse Nscan(n). The fourth control signal could be any other applicable control signal.

As shown in FIG. 2, the pixel circuit further comprises a storage capacitor Cst. One end of the storage capacitor Cst is connected to the gate of the driving transistor T1 and the other end of the storage capacitor Cst is connected to the second wire.

The storage capacitor Cst provides a corresponding voltage level to the gate of the driving transistor T1 during the light-emitting state to control the conductivity of the driving transistor T1.

As shown in FIG. 2, the pixel circuit further comprises a regulating capacitor Cboost. One end of the regulating capacitor Cboost is connected to the gate of the driving transistor T1, and the other end of the regulating capacitor Cboost is connected to the first wire.

This regulating capacitor Cboost can be used to stabilize the voltage level of the gate of the driving transistor T1.

Any one of the driving transistor T1, the write-in transistor T2, the first transistor T5, the second transistor T3, the third transistor T6, the first initializing transistor T7 and the second initializing transistor T4 can be, but not limited to, N-channel TFT. Specifically, any of them could be an indium gallium zinc oxide TFT. Preferably, any one of them can be a P-channel TFT. Specifically, any one of them can be a low-temperature polysilicon TFT. Preferably, the driving transistor T1, the write-in transistor T2, the first transistor T5, and the third transistor T6 in the pixel circuit shown in FIG. 2 are P-channel low-temperature polysilicon TFTs. The second transistor T3, the first initializing transistor T7 and the second initializing transistor T4 in the pixel circuit shown in FIG. 2 are N-channel metal oxide TFTs. In this way, the dynamic performance of the pixel circuit could be improved in a certain degree and the gate leakage current of the driving transistor T1 could be reduced in a certain degree. This makes the driving transistor T1 more durably and stably conductive in the light emitting state.

The first wire is used to transmit a first control signal. The first control signal could be, but not limited to, a $n^{th}$-stage scan signal having a negative pulse Pscan(n). In the actual implementation, the first control signal could be any other applicable control signal. The third wire is used to transmit a third control signal. The third control signal could be, but not limited to, a $n^{th}$-stage scan signal Nscan(n) having a positive pulse. Or, the third control signal could be any other applicable control signal. The fourth wire is used to transmit the fourth control signal. The fifth wire is used to transmit the fifth control signal. The data line is used to transmit a data signal DATA.

Figure 3:
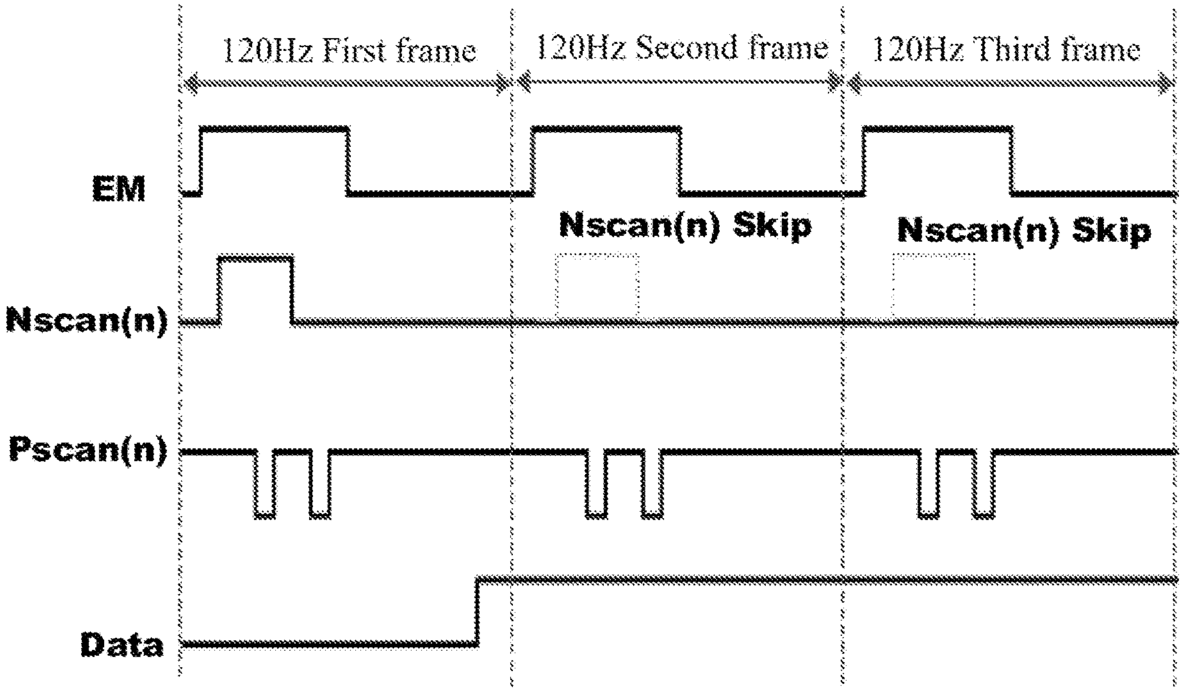
FIG. 3 is a timing diagram of the pixel circuit shown in FIG. 2.

Please refer to FIG. 3. FIG. 3 is a timing diagram of the pixel circuit shown in FIG. 2. FIG. 3 shows the first three 120 Hz frames at a 10 Hz frame rate, namely 120 Hz frame 1, 120 Hz frame 2, 120 Hz frame 3, and subsequently not-shown 120 Hz frame 4 to 120 Hz frame 12. Here, in the 120 Hz frame 1, when the fifth control signal corresponds to a high voltage level, the third transistor T6 is turned off. When the fourth control signal corresponds to a high voltage level, the second transistor T3 is turned on. One or two negative pulses of the first control signal could turn on the write-in transistor T2. At this time, the data signal DATA can be written into the gate of the driving transistor T1 through the write-in transistor T2, the drain and one of the source and drain of the driving transistor T1 and the second transistor T3. However, in any one of the subsequent 120 Hz frame 2 to 120 Hz frame 12, the fifth control signal and the first control signal still have the same waveform as the waveform of them in the 120 Hz frame 1. But the fourth control signal has no pulse and has a constant low voltage level. At this time, the second transistor T3 is turned off. The data signal DATA can only be written into the source or drain of the driving transistor T1 such that the threshold voltage of the gate of the driving transistor T1 shifts.

In the subsequent 120 Hz frame 2 to 120 Hz frame 12, the voltage level of the data signal Data can be set as the voltage level of the positive power signal VDD, so that the voltage level of the source or the drain of the driving transistor T1 is closer to the voltage level the positive power signal VDD when the driving transistor T1 is reset, which could raise the efficiency of the reset operation.

Before and after each duty cycle of write-in transistor T2, the second wire respectively resets the voltage level of one of the source and drain of driving transistor T1 through the first transistor T5.

Figure 4:
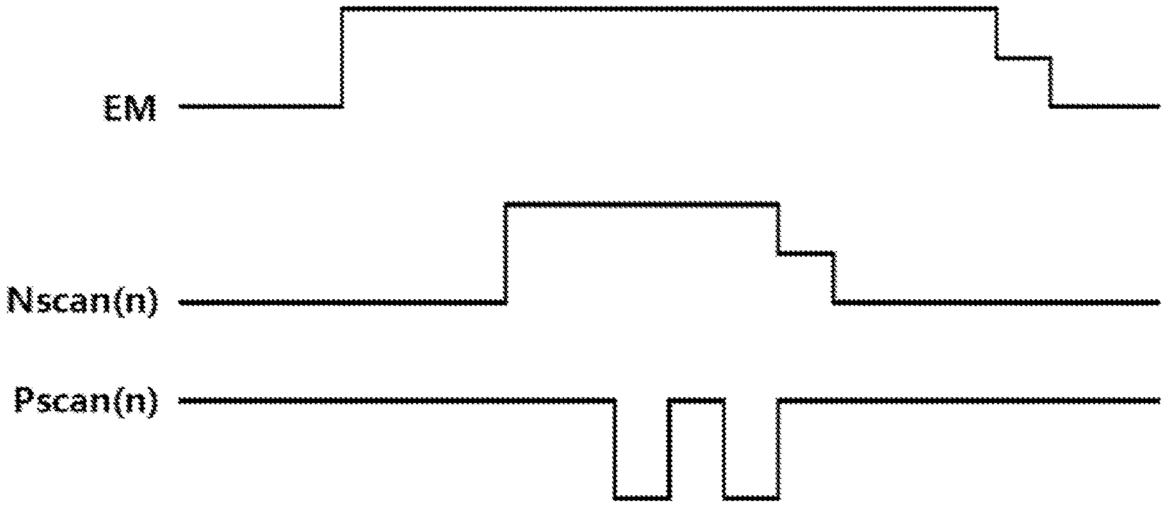
FIG. 4 is another timing diagram of the pixel circuit shown in FIG. 2.

As shown in FIG. 4, a duty cycle for writing the transistor T2 corresponds to a duty cycle of the first control signal. One duty cycle of the first control signal could comprise one or more negative pulses. For example, it can comprise two negative pulses, three negative pulses, four negative pulses or five negative pulses, etc. Each negative pulse means that a data signal Data is written. Therefore, the number of negative pulses should be reasonably set according to the resolution. Unnecessary negative pulses will occupy too much writing time and thus reduces the light emitting time.

In this embodiment, the channel type of the first transistor T5 is different from the channel type of the second transistor T3. The third wire and the fourth wire are the same wire. That is, in this case, the third control signal is the same as the fourth control signal. When the fifth control signal corresponds to a high voltage level, the third transistor T6 is turned off. During the duty cycle of the first control signal (that is, before the negative pulse arrives), the third control signal/the fourth control signal is switched from a low voltage level to a high voltage level, which means that the first transistor T5 is switched from the on state to the off state to switch its switching state. That is, the voltage level of the source or drain of the driving transistor T1 is reset by the positive power signal VDD. The second transistor T3 is switched from the off state to the on state to provide a corresponding path to transfer the data signal Data to the gate of the driving transistor T1. After the duty cycle of the first control signal (that is, after the arrival of the negative pulse), the fifth control signal still corresponds to a high voltage level and the third transistor T6 is still turned off. The third control signal/the fourth control signal is switched from the high voltage level to the low high voltage level. The first transistor T5 is switched from the off state to the on state to switch its switching state. That is, the voltage level of the source or the drain of the driving transistor T1 is reset by the positive signal VDD of the power supply. The second transistor T3 is switched from the on state to the off state to keep the gate of the driving transistor T1 from current leakage. The above operations achieve the display of predetermined luminance of one frame.

Before each duty cycle of the write-in transistor T2, the reset duration of the voltage level of one of the source and drain of the driving transistor T1 is the first reset time. After each duty cycle of the write-in transistor T2, the reset duration of the voltage level of one of the source and drain of the driving transistor T1 is the second reset time. The first reset time is equal to the second reset time.

The first reset time is equal to the second reset time, which could balance the electrical stresses on the driving transistor T1 and thus could alleviate or improve threshold voltage drift of the driver transistor T1.

As shown in FIG. 4, each duty cycle comprises at least one pulse of the first control signal. Before the duty cycle, the time period between the rising edge of the pulse of the third control signal and the rising edge of the pulse of the fifth control signal is the first reset time of one of the source and drain of the driving transistor T1. After each duty cycle, the time period between the falling edge of the pulse of the third control signal and the falling edge of the pulse of the fifth control signal is the second reset time of one of the source and drain of the driving transistor T1.

In this embodiment, the third control signal and the fifth control signal are jointly used to determine the reset time.

The time period between the falling edge of the first pulse of the third control signal and the falling edge of the first pulse of the fifth control signal is the second reset time. The time period between the falling edge of the second pulse of the third control signal and the falling edge of the second pulse of the fifth control signal is also the second reset time. Here, the second pulse is behind the first pulse in timing.

In the same control signal, a step voltage exists for a certain time between the falling edge of the first pulse and the falling edge of the second pulse. The step voltage could only turn on a corresponding transistor for a moment and cannot turn on the corresponding transistor for the whole period of time of the step voltage.

The first reset time is equal to the second reset time, which could balance the electrical stress on the driving transistor T1 and could thus alleviate or improve threshold voltage drift of the driver transistor T1.

Figure 5:
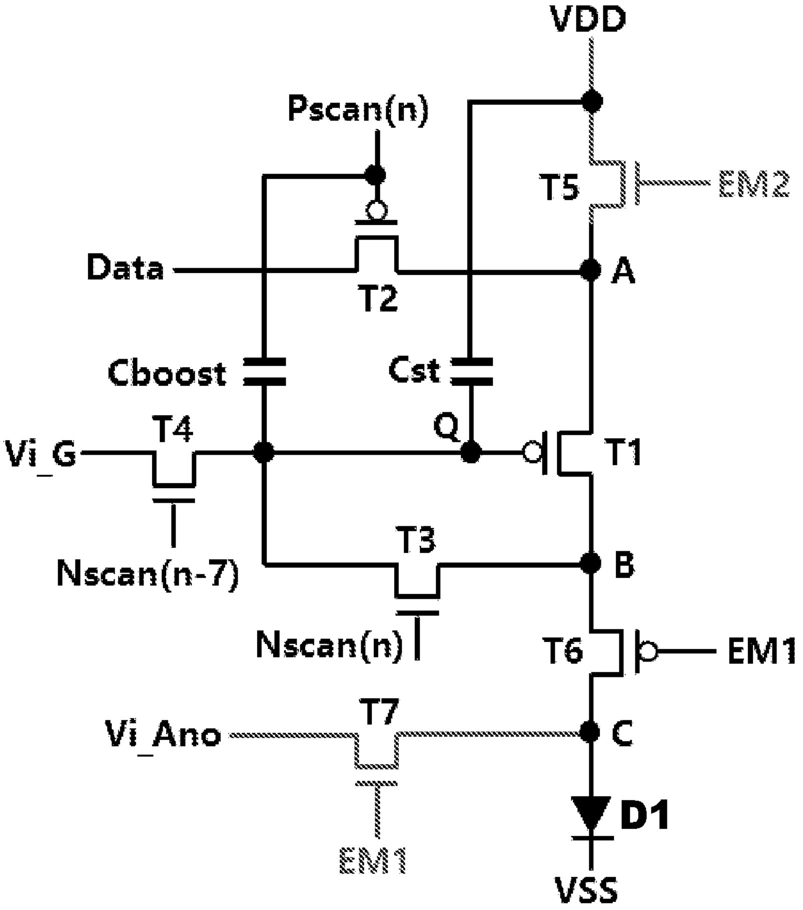
FIG. 5 is a diagram of a pixel circuit according to a second embodiment of the present disclosure.

Please refer to FIG. 5. FIG. 5 is a diagram of a pixel circuit according to a second embodiment of the present disclosure. Compared with the pixel circuit shown in FIG. 2, the channel type of the first transistor T5 is changed to the N-channel. Correspondingly, the third control signal transferred by the third wire is changed to an independent seventh control signal. The seventh control signal needs to be designed to reset the source or drain of the driving transistor T1 and create a transmission path for the light emitting current.

Figure 6:
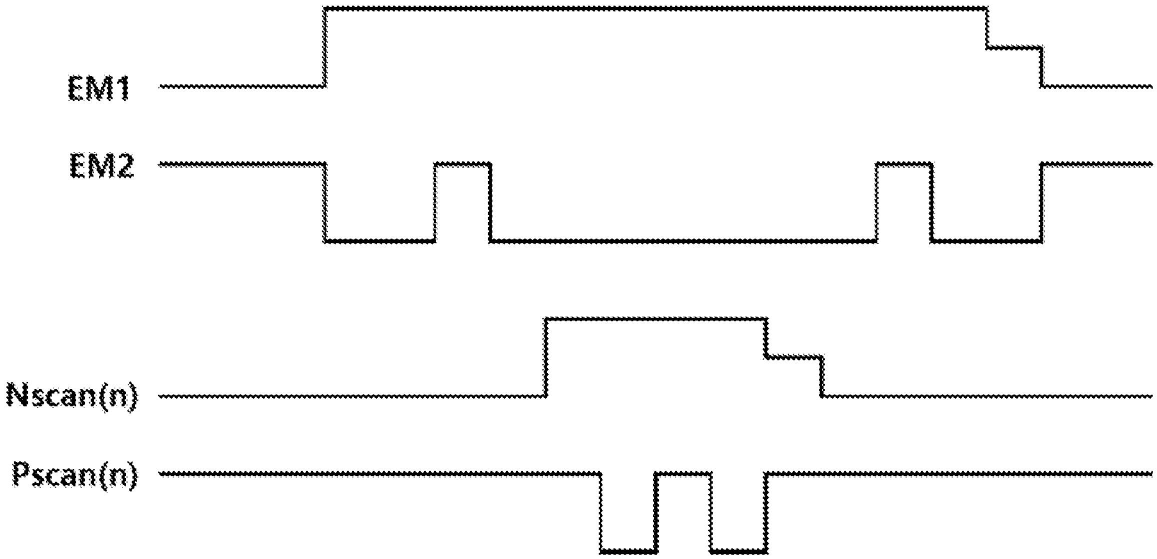
FIG. 6 is a timing diagram of the pixel circuit shown in FIG. 5.

The seventh control signal could be, but not limited to be, the control signal EM2 shown in FIG. 5 and FIG. 6. Or, the seventh control signal could be any other applicable control signal.

FIG. 6 is a timing diagram of the pixel circuit shown in FIG. 5. Compared with FIG. 4, the first control signal, the fourth control signal and the fifth control signal have the same waveforms. However, the seventh control signal has two positive pulses when it corresponds to a low voltage level. Each positive pulse could independently control the time period of turning on the first transistor T5 (the reset time of the source or the drain of the driving transistor T1). In this way, the reset time for resetting the source and the drain of the driving transistor T1 could be more accurate and flexible.

In the pixel circuit shown in FIG. 5, the first transistor T5 and the second transistor T3 are both N-channel TFTs. The third wire is different from the fourth wire for respectively transmitting different control signals. The first wire is used to transfer the first control signal. The third wire is used to transfer the seventh control signal. Before and after each duty cycle, the seventh control signal respectively has at least one positive pulse.

In this embodiment, before and after the duty cycle, the source and the drain of the driving transistor T1 could be reset and the time duration of each positive pulse could be independently modulated to be the same or different.

As shown in FIG. 6, before each duty cycle, the seventh control signal has a first positive pulse. After each duty cycle, the seventh control signal has a second positive pulse. The duration of the first positive pulse is equal to the duration of the second positive pulse.

This embodiment could be a preferred embodiment. It not only reduces the number of the pulses in the seventh control signal, but also flexibly and accurately control the reset time of the source or the drain of the driving transistor T1.

In one embodiment, during a continuous turning off state of the third transistor T6, the first transistor T5 is turned on at least once before and after the duty cycle.

When the fifth control signal continuously corresponds to a high voltage level, the third transistor T6 correspondingly corresponds to a continuous turning off state. At this time, the pixel circuit is in a non-light-emitting state, which may provide an independent time period for the resetting the source and drain of the driving transistor T1.

Every time when the first transistor T5 is turned on, the source and drain of the driving transistor T1 could be reset. The turning on period of the first transistor T5 is the reset time for resetting the source and drain of the driving transistor T1.

Each duty cycle of the fourth control signal corresponds to at least one duty cycle of the first control signal.

In a frame, the first control signal may have one or more duty cycles but the fourth control signal has only one duty cycle. The duty cycle of the fourth control signal corresponds only to the first duty cycle of the first control signal. In this case, the on state of the second transistor T3 is synchronized with the on state of the write-in transistor T2 to provide a transmission path for a data signal Data to be inputted to the gate of the driving transistor T1.

In a frame, the first duty cycle of the first control signal at least partially overlaps with one duty cycle of the fourth control signal in timing. The fourth control signal does not include any other duty cycles in one frame.

The starting time of a duty cycle of the fourth control signal is prior to the starting time of the first duty cycle of the first control signal. The ending time of the duty cycle of the fourth control signal is later than an ending time of the first duty cycle of the first control signal.

In this embodiment, the conductive (on) time period of the second transistor T3 could cover the conductive (on) time period of the write-in transistor T2. This could further ensure that the data signal Data could be smoothly written into the gate of the driving transistor T1 without any loss.

FIG. 7 is a diagram of a pixel circuit according to a third embodiment of the present disclosure. The difference between FIG. 7 and FIG. 2 is: the first initializing transistor T7 is a P-channel low temperature polysilicon TFT. This could further raise the dynamic performance of the pixel circuit and optimize the layout design of each TFT in the pixel circuit so as to make the pixel circuit highly practical. Correspondingly, the gate of the first initializing transistor T7 is connected to the seventh wire, and the seventh wire is used to transmit the eighth control signal. Here, the first control signal and the eighth control signal can be scan signals having negative pulses outputted from the same gate drive circuit as long as the first control signal is behind the eighth control signal in timing. The first control signal and the eighth control signal can be any scan signal with negative pulses. For example, the eighth control signal could be the $(n-1)^{th}$-stage scan signal Pscan(n−1) having a negative pulse shown in FIG. 7.

Figure 8:
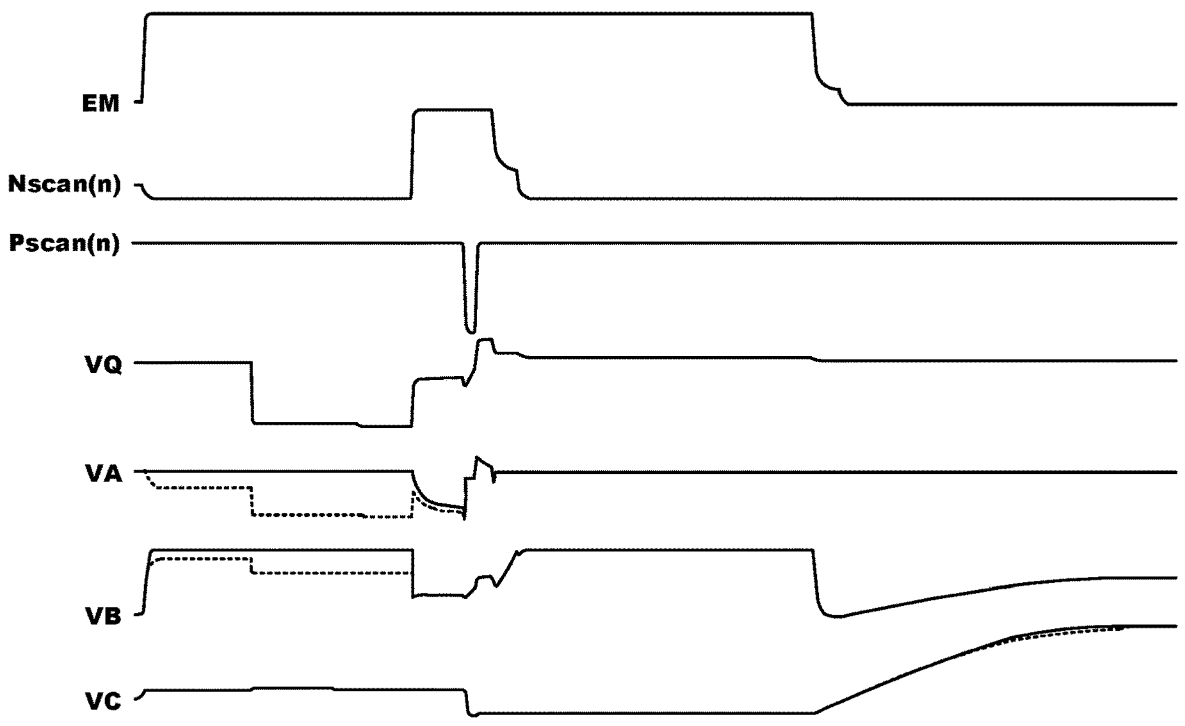
FIG. 8 is a diagram of the simulated waveforms of the corresponding signals and voltage levels of the nodes in the pixel circuit shown in FIG. 2.

FIG. 8 is a diagram of the simulated waveforms of the corresponding signals and voltage levels of the nodes in the pixel circuit shown in FIG. 2. Here, VQ represents the waveform of the voltage level at the node Q. VA represents the waveform of the voltage level at the node Q. VB represents the waveform of the voltage level at the node B. VC represents the waveform of the voltage level at the node C. It could be seen that, compared with FIG. 4, the first control signal only shows a pulse in this simulated waveform. It could be understood that the voltage level VA at the node A is stable before and after one duty cycle of the first control signal no matter the first signal has one or more pulses. Because the voltage level VA at the node B is related to the voltage level VB of the node A, the voltage level VB at the node B is also stable. That is, the voltage levels of the source and the drain of the driving transistor T1 are stable before and after the data signal Data is written into the driving transistor T1. In other words, the voltage levels of the three electrodes of the driving transistor T1 remain stable before and after the data signal Data is written into the driving transistor T1. This could effectively alleviate the threshold voltage shift of the driving transistor T1 in a low frequency working mode.

Figure 9:
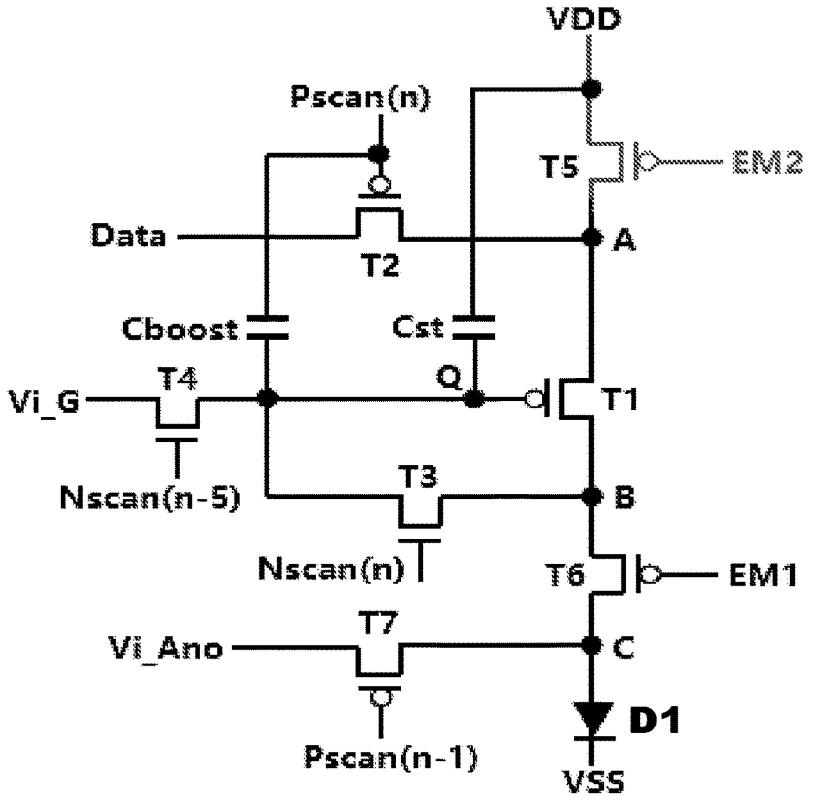
FIG. 9 is a diagram of a pixel circuit according to a fourth embodiment of the present disclosure.

FIG. 9 is a diagram of a pixel circuit according to a fourth embodiment of the present disclosure. Compared with FIG. 7, the first transistor T5 is a P-channel TFT. In the actual implementation, the first transistor T5 could be a low temperature polysilicon TFT.

Figure 10:
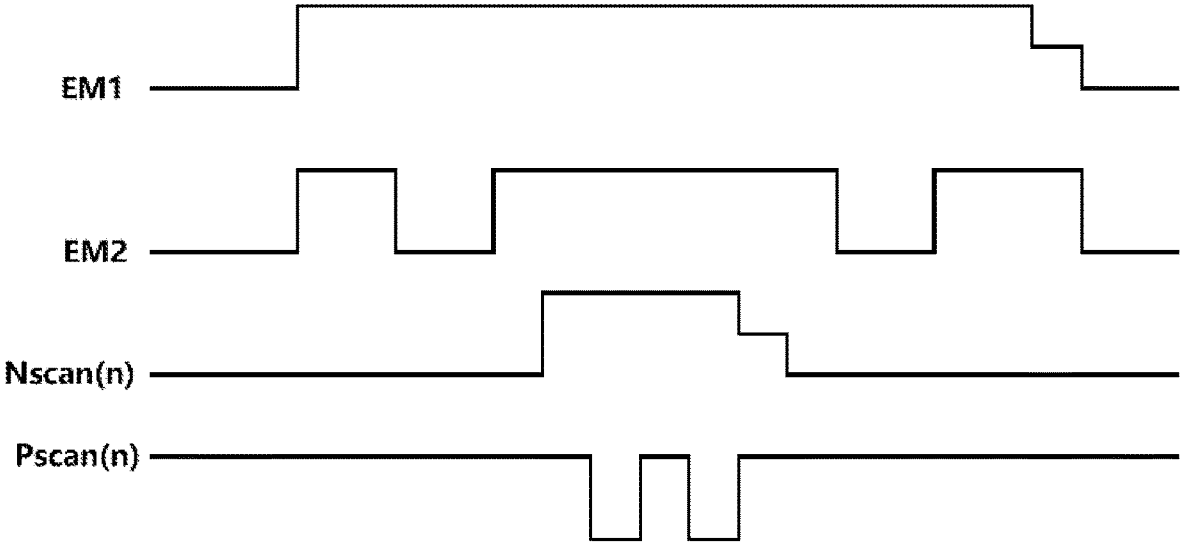
FIG. 10 is a timing diagram of the pixel circuit shown in FIG. 9.

As shown in FIG. 9 and FIG. 10, the first transistor T5 is a P-channel TFT. The third wire is used to transfer a tenth control signal. Before each duty cycle of the write-in transistor T2, the voltage level of the tenth control signal is orderly a high voltage level, a low voltage level and a high voltage level. After each duty cycle of the write-in transistor T2, the voltage level of the tenth control signal is orderly a high voltage level, a low voltage level and a high voltage level. During each duty cycle of the write-in transistor T2, the voltage level of the tenth control signal is maintained as a high voltage level.

In this embodiment, when the tenth control signal corresponds to a low voltage level, the first transistor T5 is turned on (in a conductive state). At this time, one of the source and drain of the driving transistor T1 could be reset before and after each duty cycle of the write-in transistor T2 so as to maintain the voltage stability of the drain of the driving transistor T1, which is related to the source voltage of the driving transistor T1. In this way, the stability of the voltage levels of the three electrodes of the driving transistor T1 could be maintained before and after each duty cycle of the write-in transistor T2 to reduce the threshold voltage shift.

As shown in FIG. 9 and FIG. 10, the time duration that the tenth control signal is in the low voltage level before each duty cycle of the write-in transistor T2 is equal to the time duration that the tenth control signal is in the low voltage level after each duty cycle of the write-in transistor T2.

This embodiment could facilitate the balance of the electrical stresses applied to the driving transistor T1 and further alleviate or improve the threshold voltage drift of the driver transistor T1.

Figure 12:
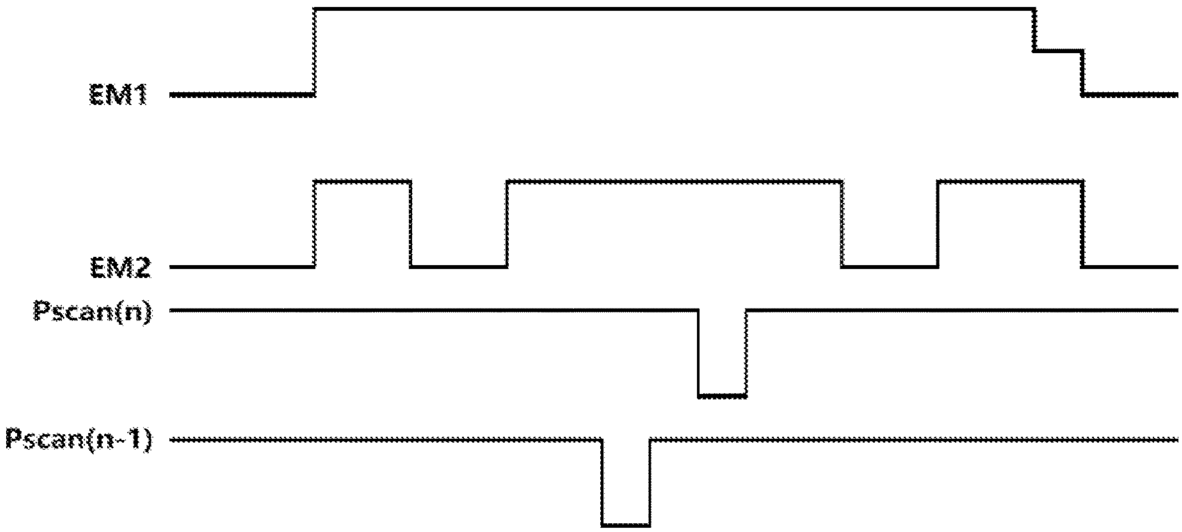
FIG. 12 is a timing diagram of the pixel circuit shown in FIG. 11.

The tenth control signal could be the signal EM2 shown in FIG. 10 and FIG. 12.

Figure 11:
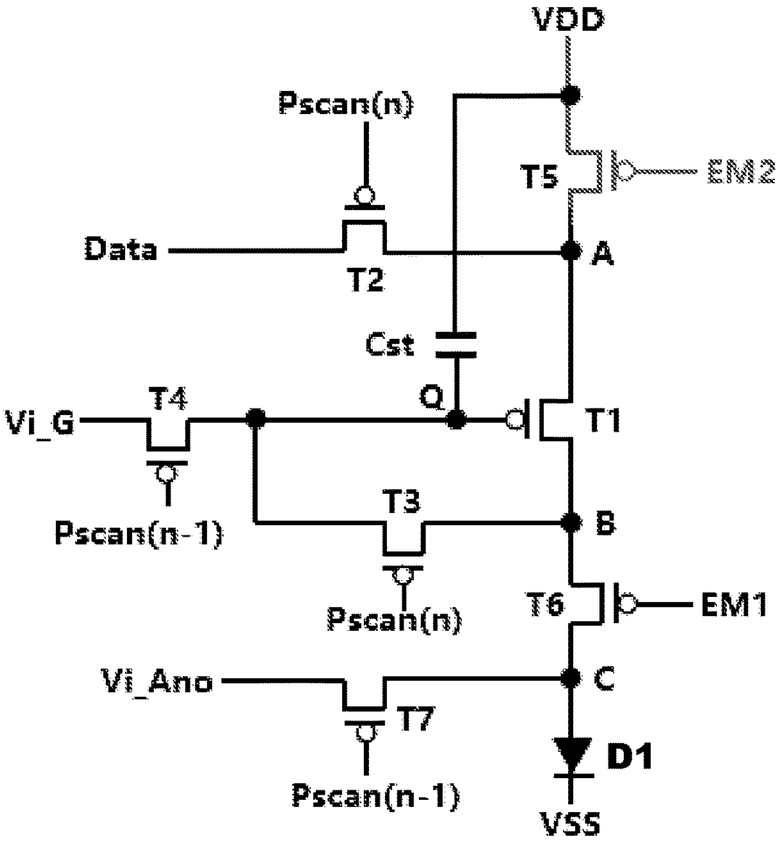
FIG. 11 is a diagram of a pixel circuit according to a fifth embodiment of the present disclosure.

As shown in FIG. 11, the second transistor T3 is a P-channel TFT. The first wire is connected to the fourth wire.

In this embodiment, the first wire and the fourth wire could be the same wire. In this way, the number of the wires in the pixel circuit could be reduced and thus the aperture rate could be raised.

The pixel circuit further comprises a second initializing transistor T4. One of the source and drain of the second initializing transistor T4 is connected to the gate of the driving transistor T1. The other of the source and drain of the second initializing transistor T4 is connected to a second initializing wire. The gate of the second initializing transistor T4 is connected to the gate of the first initializing transistor T7. Here, the channel type of the second initializing transistor T4 is the same as the channel type of the first initializing transistor T7.

The gate of the first initializing transistor T7 and the gate of the second initializing transistor T4 could share the same wire, so that the number of wires in the pixel circuit can be reduced and thus the aperture rate of the pixel can be improved.

The first initializing transistor T7 and the second initializing transistor T4 are double-gate TFTs. In the actual implementation, the first initializing transistor T7 and the second initializing transistor T4 can also be low-temperature polysilicon TFTs.

When the first initializing transistor T7 and the second initializing transistor T4 are double-gate low-temperature polysilicon TFTs, the process can be simplified and the cost can be reduced.

As shown in FIG. 12, in each duty cycle of the write-in transistor T2, the signal Pscan(n) and the signal Pscan (n−1) could have only one negative pulse or multiple negative pulses.

According to an embodiment of the present disclosure, a display panel is disclosed. The display panel comprises a pixel circuit of any one of the above-mentioned embodiments.

In this embodiment, the display panel utilizes the first transistor T5 to respectively switch at least once its switching state before and after each duty cycle of the write-in transistor T2. This could reset the voltage level of one electrode of the driving transistor T1 every time when the switching state is switched. In this way, the voltage level of the electrode of the driving transistor T1 can be stabilized in the low-frequency working mode, and the voltage level of another electrode of the driving transistor T1 is related to the voltage level of the electrode of the driving transistor. Accordingly, when the electrode of the driving transistor T1 has a stable voltage level, the another electrode of the driving transistor T1 could also have a stable voltage level. In this way, the driver transistor can maintain the stabilities of the voltage levels of the three electrodes of the driving transistor T1 in the high and low frequency working modes, which alleviates the threshold voltage shift of the driving transistor T1 in the low frequency working mode and also alleviates the flickers caused by the regular change of luminance.

Furthermore, because the first transistor T5 can not only reset the electrode of the driving transistor T1 in the non-light-emitting stage but also control the light emitting current in the light-emitting stage, this could reduce the number of TFTs used in the pixel circuit, simplify the structure of the pixel circuit, and improve the pixel density because the first transistor has multiple uses.

As the frame rate of the display panel decreases, the frequency of the first control signal remains unchanged, and the frequency of the fourth control signal decreases.

It should be noted that the low frequency in the present disclosure may be a refresh frequency below 30 Hz, for example, 20 Hz, 10 Hz, 1 Hz, 0.5 Hz, . . . and so on. The high frequency in the present disclosure may be a refresh frequency above 30 Hz, for example, 60 Hz, 90 Hz, 120 Hz, 240 Hz, . . . and so on.

Above are embodiments of the present disclosure, which does not limit the scope of the present disclosure. Any modifications, equivalent replacements or improvements within the spirit and principles of the embodiment described above should be covered by the protected scope of the disclosure.

What is claimed is:

1. A pixel circuit, comprising:

a driving transistor, having a source, a drain and a gate;

a write-in transistor, having a source, a drain and a gate, wherein one of the source and the drain of the write-in transistor is connected to one of the source and the drain of the driving transistor, another one of the source and the drain of the write-in transistor is connected to a data line, and the gate of the write-in transistor is connected to a first wire;

a first transistor, having a source, a drain and a gate, wherein one of the source and the drain of the first transistor is connected to a second wire, another one of the source and the drain of the first transistor is connected to the one of the source and the drain of the driving transistor, and the gate of the first transistor is connected to a third wire;

a second transistor, having a source, a drain and a gate, wherein one of the source and the drain of the second transistor is connected to another one of the source and the drain of the driving transistor, another one of the source and the drain of the second transistor is connected to the gate of the driving transistor, and the gate of the second transistor is connected to a fourth wire;

a third transistor, having a source, a drain and a gate, wherein one of the source and the drain of the third transistor is connected to the another one of the source and the drain of the driving transistor, and the gate of the third transistor is connected to a fifth wire;

a light emitting device, having an anode connected to another one of the source and the drain of the third transistor, and a cathode connected to a sixth wire; and a first initializing transistor, having a source, a drain and a gate, wherein one of the source and the drain of the first initializing transistor is connected to the anode of the light emitting device, another one of the source and the drain of the first initializing transistor is electrically connected to a first initializing wire, and the gate of the first initializing transistor is connected to the fifth wire, wherein the first transistor is configured to, when the third transistor is kept turned off, switch an on/off state at least once before each duty cycle of the write-in transistor and switch the on/off state at least once after the each duty cycle of the write-in transistor;

wherein the first wire is configured to transfer a first control signal, the fourth wire is configured to transfer a fourth control signal, and a frequency of the first control signal remains unchanged and a frequency of the fourth control signal decreases as a frame rate of a display panel including the pixel circuit decreases; and wherein a channel type of the first transistor is different from a channel type of the second transistor, and the third wire and the fourth wire are a same wire.

2. The pixel circuit of claim 1, wherein the second wire is configured to respectively reset a voltage level of the one of the source and the drain of the driving transistor through the first transistor before and after the each duty cycle of the write-in transistor.

3. The pixel circuit of claim 2, wherein a first reset duration indicates a reset duration of the voltage level of the one of the source and the drain of the driving transistor before the each duty cycle of the write-in transistor; a second reset duration indicates a reset duration of the voltage level of the one of the source and the drain of the driving transistor after the each duty cycle of the write-in transistor; and the first reset duration is equal to the second reset duration.

4. The pixel circuit of claim 1, wherein the third wire is configured to transfer a third control signal and the fifth wire is configured to transfer a fifth control signal; and wherein the each duty cycle of the write-in transistor comprises at least one pulse of the first control signal; before the each duty cycle of the write-in transistor, a time period between a rising edge of a pulse of the third control signal and a rising edge of a pulse of the fifth control signal is a first reset duration of the one of the source and the drain of the driving transistor; and after the each duty cycle of the write-in transistor, a time period between a falling edge of the pulse of the third control signal and a falling edge of the pulse of the fifth control signal is a second reset duration of the one of the source and the drain of the driving transistor.

5. The pixel circuit of claim 4, wherein a time period between a first falling edge of the pulse of the third control signal and a first falling edge of the pulse of the fifth control signal is the second reset duration; a time period between a second falling edge of the pulse of the third control signal and a second falling edge of the pulse of the fifth control signal is also the second reset duration; the second falling edge of the pulse of the third control signal is behind the first falling edge of the pulse of the third control signal in timing; and the second falling edge of the pulse of the fifth control signal is behind the first falling edge of the pulse of the fifth control signal in timing.

6. The pixel circuit of claim 5, wherein the first reset duration is equal to the second reset duration.

7. The pixel circuit of claim 1, wherein the first transistor and the second transistor are both N-channel thin film transistors (TFTs); the third wire is different from the fourth wire; the third wire is configured to transfer a seventh control signal; and the seventh control signal respectively has at least one positive pulse before and after the each duty cycle of the write-in transistor.

8. The pixel circuit of claim 7, wherein before the each duty cycle of the write-in transistor, the seventh control signal has a first positive pulse; after the each duty cycle of the write-in transistor, the seventh control signal has a second positive pulse; and a time duration of the first positive pulse is equal to a time duration of the second positive pulse.

9. The pixel circuit of claim 7, wherein when the third transistor is turned off, the first transistor is turned on at least once respectively before and after one duty cycle of the write-in transistor.

10. The pixel circuit of claim 1, wherein the third transistor is a P-channel TFT and the first initializing transistor is an N-channel TFT.

11. The pixel circuit of claim 10, further comprising:

a second initializing transistor, having a source, a drain and a gate, wherein one of the source and the drain of the second initializing transistor is connected to the gate of the driving transistor, another one of the source and the drain of the second initializing transistor is connected to a second initialization line, and the gate of the second initializing transistor is connected to the gate of the first initializing transistor.

12. The pixel circuit of claim 1, wherein each duty cycle of the fourth control signal corresponds to at least one duty cycle of the first control signal.

13. The pixel circuit of claim 12, wherein in a frame, a first duty cycle of the first control signal at least partially overlaps with one duty cycle of the fourth control signal in timing; and the fourth control signal does not have another duty cycle within the frame.

14. The pixel circuit of claim 12, wherein a starting time of a duty cycle of the fourth control signal is prior to a starting time of a first duty cycle of the first control signal; and an ending time of the duty cycle of the fourth control signal is later than an ending time of the first duty cycle of the first control signal.

15. The pixel circuit of claim 1, wherein the first transistor is a P-channel TFT; the third wire is configured to transfer a tenth control signal; before each duty cycle of the write-in transistor, a voltage level of the tenth control signal has a sequence of a high voltage level, a low voltage level and a high voltage level; after each duty cycle of the write-in transistor, the voltage level of the tenth control signal has a sequence of a high voltage level, a low voltage level and a high voltage level; and during each duty cycle of the write-in transistor, the voltage level of the tenth control signal is maintained as a high voltage level.

16. The pixel circuit of claim 15, wherein a time during which the tenth control signal is in the low voltage level before each duty cycle of the write-in transistor is equal to a time during which the tenth control signal is in the low voltage level after each duty cycle of the write-in transistor.

17. A display panel, comprising a pixel circuit, the pixel circuit comprising:

a driving transistor, having a source, a drain and a gate;

a write-in transistor, having a source connected to the source of the driving transistor, a drain connected to a data line, and a gate connected to a first wire;

a first transistor, having a source connected to a second wire, a drain connected to the source of the driving transistor, and a gate connected to a third wire;

a second transistor, having a source connected to the drain of the driving transistor, a drain connected to the gate of the driving transistor, and a gate connected to a fourth wire;

a third transistor, having a source, a drain and a gate, wherein one of the source and the drain of the third transistor is connected to the drain of the driving transistor, and the gate of the third transistor is connected to a fifth wire;

a light emitting device, having an anode connected to another one of the source and the drain of the third transistor, and a cathode connected to a sixth wire; and a first initializing transistor, having a source, a drain and a gate, wherein one of the source and the drain of the first initializing transistor is connected to the anode of the light emitting device, another one of the source and the drain of the first initializing transistor is electrically connected to a first initializing wire, and the gate of the first initializing transistor is connected to the fifth wire, wherein the first transistor is configured to, when the third transistor is kept turned off, switch an on/off state at least once before each duty cycle of the write-in transistor and switch the on/off state at least once after the each duty cycle of the write-in transistor;

wherein the first wire is configured to transfer a first control signal, the fourth wire is configured to transfer a fourth control signal, and a frequency of the first control signal remains unchanged and a frequency of the fourth control signal decreases as a frame rate of the display panel decreases; and wherein a channel type of the first transistor is different from a channel type of the second transistor; and the third wire and the fourth wire are a same wire.

* * * * *